(12) United States Patent
Lee et al.

(10) Patent No.: US 11,232,836 B2
(45) Date of Patent: Jan. 25, 2022

(54) RESISTIVE RANDOM ACCESS MEMORY DEVICE

(71) Applicant: Taiwan Semiconductor Manufacturing Co., Ltd., Hsin-Chu (TW)

(72) Inventors: Chia-Fu Lee, Hsinchu (TW); Yu-Der Chih, Hsin-Chu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/180,283

(22) Filed: Feb. 19, 2021

(65) Prior Publication Data

US 2021/0183444 A1 Jun. 17, 2021

Related U.S. Application Data

(63) Continuation of application No. 16/742,804, filed on Jan. 14, 2020, now Pat. No. 10,930,347, which is a continuation of application No. 15/904,093, filed on Feb. 23, 2018, now Pat. No. 10,546,638.

(60) Provisional application No. 62/564,617, filed on Sep. 28, 2017.

(51) Int. Cl.
*G11C 16/10* (2006.01)
*G11C 13/00* (2006.01)

(52) U.S. Cl.
CPC ........ *G11C 13/0069* (2013.01); *G11C 13/003* (2013.01); *G11C 13/004* (2013.01); *G11C 13/0064* (2013.01); *G11C 2013/0045* (2013.01); *G11C 2013/0054* (2013.01); *G11C 2013/0066* (2013.01); *G11C 2013/0078* (2013.01)

(58) Field of Classification Search
CPC .. G11C 13/0069; G11C 13/003; G11C 13/004
USPC ......................................................... 365/148
See application file for complete search history.

(56) References Cited

U.S. PATENT DOCUMENTS

| | | |
|---|---|---|
| 8,929,124 B2 | 1/2015 | Kim |
| 9,082,496 B2 | 7/2015 | Lee |
| 10,026,486 B1 * | 7/2018 | Dutta ................... G11C 29/021 |
| 2013/0235648 A1 | 9/2013 | Kim |
| 2014/0169068 A1 | 6/2014 | Lee |
| 2014/0219002 A1 | 8/2014 | Lee |
| 2017/0092356 A1 | 3/2017 | Wu |

FOREIGN PATENT DOCUMENTS

CN 106558335 A 4/2017

* cited by examiner

*Primary Examiner* — Xiaochun L Chen
(74) *Attorney, Agent, or Firm* — Duane Morris LLP

(57) ABSTRACT

A memory device includes: a memory bit cell; a write circuit, coupled to the memory bit cell, and configured to use a first voltage to transition the memory bit cell to a first logic state by changing a respective resistance state of the memory bit cell, and compare a first current flowing through the memory bit cell with a first reference current; and a control logic circuit, coupled to the write circuit, and configured to determine whether the first logic state is successfully written into the memory bit cell based on a read-out logic state of the memory bit cell and the comparison between the first current and first reference current.

20 Claims, 6 Drawing Sheets

RESISTIVE RANDOM ACCESS MEMORY DEVICE

CROSS-REFERENCE TO RELATED APPLICATION

This application is a continuation application of U.S. patent application Ser. No. 16/742,804, filed Jan. 14, 2020, which is a continuation application of U.S. patent application Ser. No. 15/904,093, filed Feb. 23, 2018, which claims priority to U.S. Provisional Patent Application No. 62/564,617, filed on Sep. 28, 2017, each of which are incorporated by reference herein in their entireties.

BACKGROUND

In recent years, unconventional nonvolatile memory (NVM) devices, such as ferroelectric random access memory (FRAM) devices, phase-change random access memory (PRAM) devices, and resistive random access memory (RRAM) devices, have emerged. In particular, RRAM devices, which exhibit a switching behavior between a high resistance state and a low resistance state, have various advantages over conventional NVM devices. Such advantages include, for example, compatible fabrication steps with current complementary-metal-oxide-semiconductor (CMOS) technologies, low-cost fabrication, a compact structure, flexible scalability, fast switching, high integration density, etc.

Generally, an RRAM device, or more particularly an RRAM bit cell, includes a top electrode (e.g., an anode) and a bottom electrode (e.g., a cathode) with a variable resistance dielectric layer interposed therebetween. When writing the RRAM bit cell, a 'set' voltage is applied across the top and bottom electrodes to change the variable resistance dielectric layer from a first resistivity (e.g., a high resistance state (HRS)) to a second resistivity (e.g., a low resistance state (LRS)). And, a 'reset' voltage (e.g., smaller than the set voltage in an absolute value) is applied across the top and bottom electrodes to change the variable resistance dielectric layer from the second resistivity back to the first resistivity, for example, from LRS to HRS. Therefore, the LRS and HRS may correspond to a logic "1" and a logic "0" (or vice versa), respectively, of the RRAM bit cell.

When performing such a write operation to a RRAM bit cell of a conventional RRAM device, however, a cell current flowing through the RRAM bit cell is not monitored, which disadvantageously affects endurance of the RRAM bit cell (i.e., a lifetime of the RRAM bit cell). In particular, since a resistivity of the RRAM bit cell varies during a write operation, without monitoring the cell current, the RRAM bit cell may be overly written, which in turn shortens the endurance of the RRAM bit cell. Further, an increasing number of such overly written RRAM bit cells, typically known as "tailing bits," deteriorates a yield of the conventional RRAM device. Thus, conventional RRAM devices are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
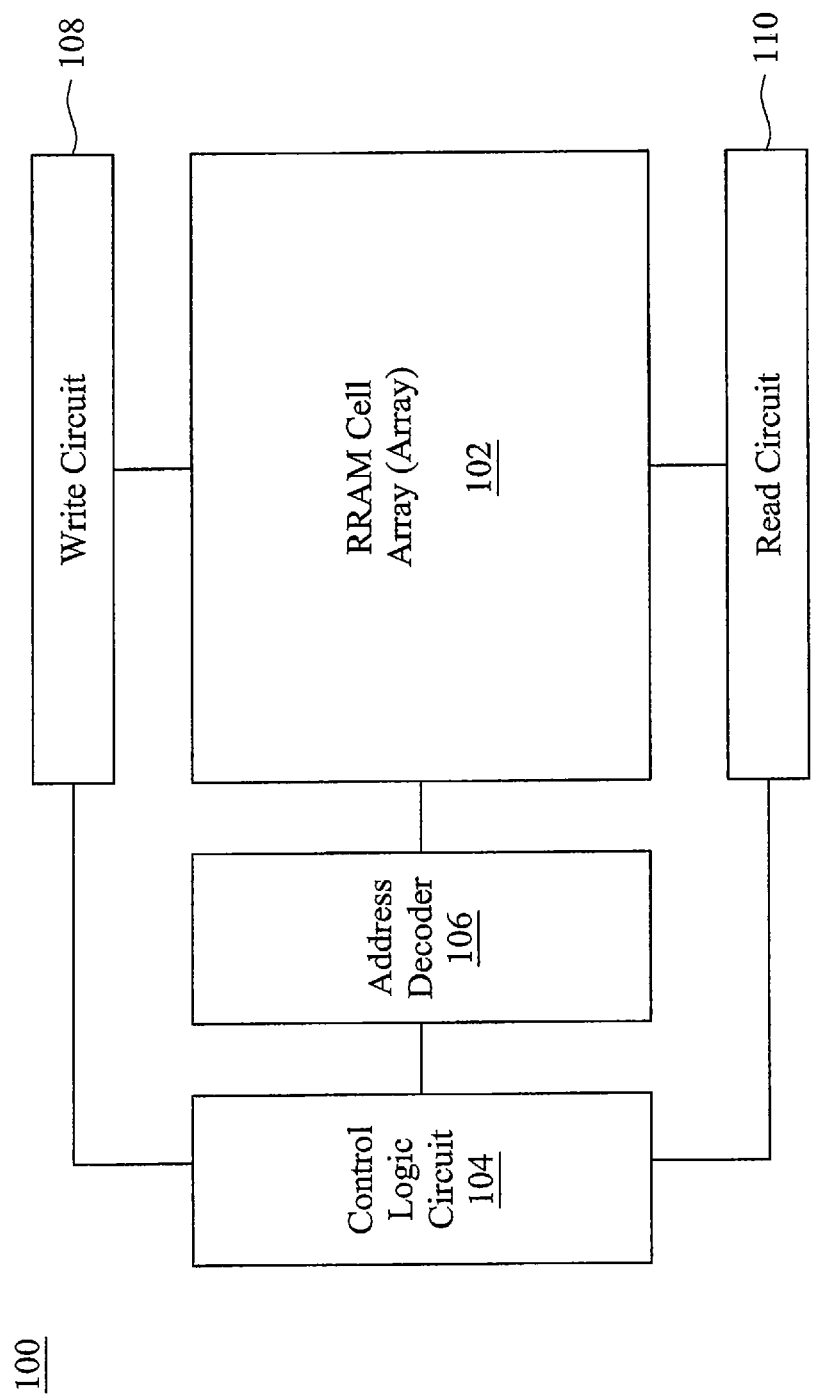
FIG. 1 illustrates a block diagram of a resistive type random access memory (RRAM) device, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure provides various embodiments of a novel resistive type random access memory (hereinafter "RRAM") device including a write circuit and a read circuit controlled by a control logic circuit. In some embodiments, the write circuit is configured to provide a write voltage signal to an RRAM bit cell to cause the RRAM bit cell to transition to either a logic 1 or 0, and monitor a write current signal flowing through the RRAM bit cell by comparing the write current signal to a corresponding reference current signal. In response to the monitored result during the write operation, the control logic circuit may cause the write circuit to iteratively increase a voltage level of the write voltage signal (and a current level of the corresponding reference current signal), or cause the read circuit to provide a read-out of a logic state of the RRAM bit cell. Further, in response to the read-out of the logic state (e.g., a read operation), the control logic circuit may determine whether an intended logic state has been successfully written to the RRAM bit cell, and if not, cause the write circuit to iteratively increase the voltage level of the write voltage signal and current level of the corresponding reference current signal until the intended logic state has been successfully written to the RRAM bit cell. Due to such a combination of write and read monitoring, the above-mentioned issues in the conventional RRAM device may be advantageously avoided.

FIG. 1 illustrates an exemplary block diagram of an RRAM device 100, in accordance with various embodiments. As shown, the RRAM device 100 includes an RRAM cell array 102 (hereinafter "array 102"), a control logic circuit 114, an address decoder 106, a write circuit 108, and a read circuit 110. In some embodiments, the array 102 includes a plurality of resistive type memory bit cells (e.g., spin transfer torque (STT) magnetoresistive random access memory (MRAM) bit cells, MRAM bit cells without STT, memristor RAM bit cells, RRAM bit cells, conductive bridge random access memory (CBRAM) bit cells, etc.) arranged in a column-row configuration. For brevity, the plurality of resistive type memory bit cells in the array 102 are herein referred to as "bit cells."

The plurality of bit cells of the array 102 are arranged in the column-row configuration. Accordingly, the bit cells are arranged along plural rows and columns, and each of the bit cells is, or can be, located at a respective combination of row and column addresses. In some embodiments, each row of the array 102 may include corresponding word line (WL) and source line (SL), and each column of the array 102 may include a corresponding bit line (BL). As such, each bit cell of the array 102 may have respective WL, SL, and BL to be electrically coupled to other circuits. e.g., the write circuit 108, the read circuit 110, etc., which will be discussed in further detail below.

It is noted that the block diagram shown in FIG. 1 is simplified for illustration purposes, so the RRAM device 100 may include one or more other circuits, which may be integrated into one of the shown circuits (102, 104, 106, 108, and 110) or disposed separately. For example, the RRAM device 100 may include at least a multiplexer circuit used to select one or more columns/rows from the plurality of columns/rows. Such a multiplexer circuit may be integrated into the write circuit 108 and/or the read circuit 110, in accordance with some embodiments. Further, the RRAM device 100 may include a circuit (e.g., voltage controller) configured to generate a set/reset voltage (as mentioned above) for each of the bit cells of the array 102. Such a voltage controller circuit may be integrated into the write circuit 108 or separately disposed as a respective circuit, in accordance with some embodiments.

Referring still to FIG. 1, in some embodiments, the control logic circuit 104 is coupled to the array 102 by the address decoder 106. The address decoder 106 may include at least a row decoder and a column decoder. In some embodiments, the control logic circuit 104 is configured to provide an address combination, containing a row address and a column address, to the decoder 106. The decoder 106 uses the address combination to assert (e.g., activate) a bit cell of the array 102 that is located at the address combination of the column and row addresses. Upon being activated, in some embodiments, the control logic circuit 104 may initiate an access operation to the activated bit cell of the array 102. In accordance with some embodiments, such an access operation may include at least a read operation (e.g., to read out a logic state of the bit cell of the array 102), and in response to the read operation, further includes zero or at least one write operation, which will be discussed in further detail below.

Figure 2A:
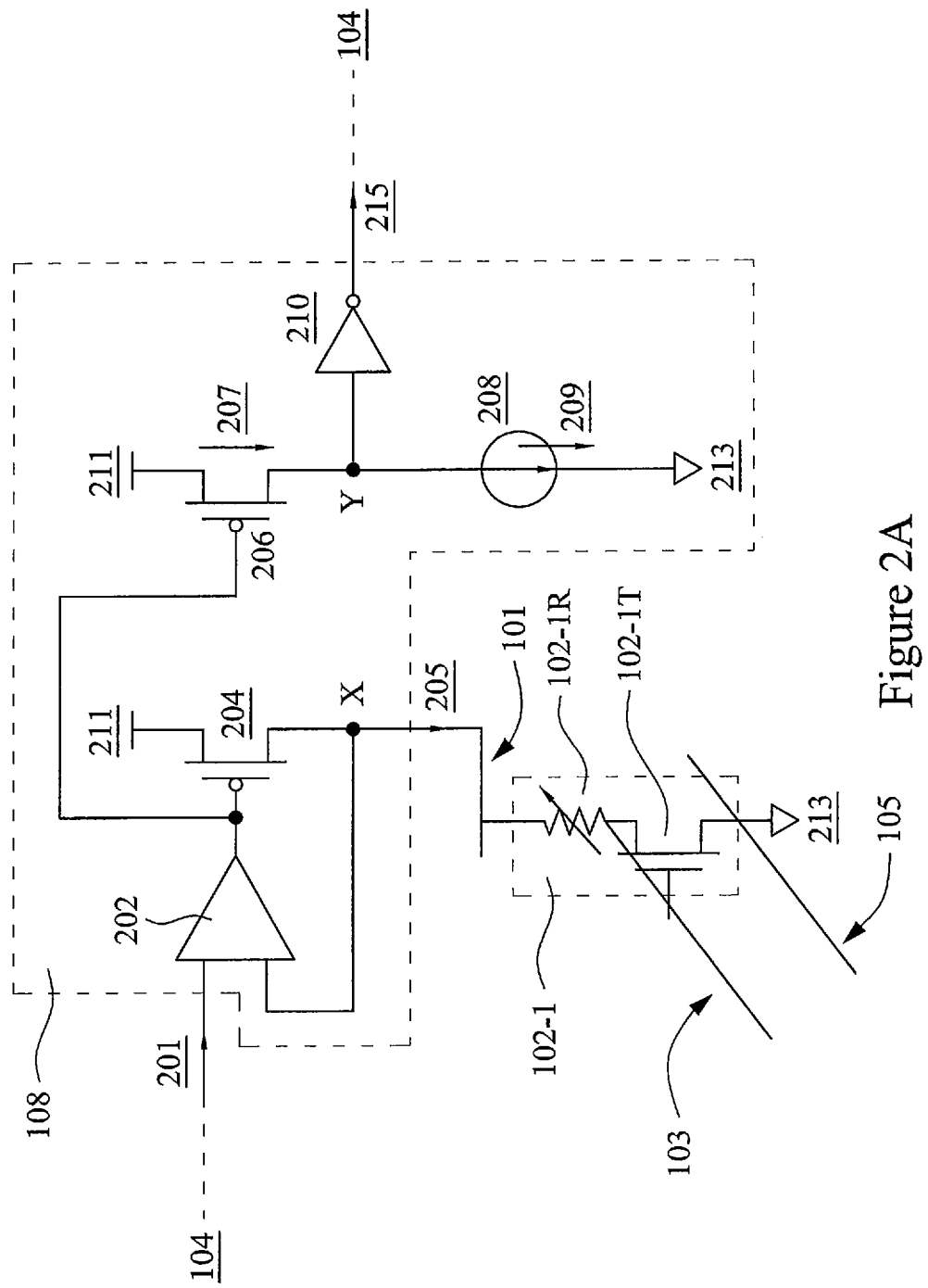
FIG. 2A illustrates an exemplary circuit diagram of a write circuit of the RRAM device of FIG. 1, in accordance with some embodiments.

FIG. 2A illustrates an exemplary circuit diagram of the write circuit 108, in accordance with some embodiments. In the illustrated embodiment of FIG. 2A, the write circuit 108 includes an operational amplifier (typically knowns as "OP") 202, a first transistor 204, a second transistor 206, a reference current source 208, and a buffer circuit 210.

The OP 202, which may serve as a comparator, has first and second inputs configured to receive a voltage signal 201 from the control logic circuit 104 and a voltage signal at node "X," respectively, and an output coupled to respective gates of the first transistor 204 and second transistor 206. The first transistor 204 is coupled to a first supply voltage 211 (e.g., Vdd) at its respective source and coupled to an exemplary bit cell 102-1 at its respective drain, also the node X. The second transistor 206, with its gate tied to the output of the OP 202 and the gate of the first transistor 204, is coupled to the first supply voltage 211 (e.g., Vdd) at its respective source and coupled to the current source 208 at its respective drain, also at node "Y."

The current source 208, configured to provide a reference current signal 209, is coupled between the node Y and a second supply voltage 213 (e.g., ground). The buffer circuit 210, which may include an inverter, is coupled between the node Y and configured to provide a write current comparison signal 215 to the control logic circuit 104. Further details of operations of the write circuit 108 will be discussed below. The first transistor 204 and second transistor 206 are each implemented by a p-type metal-oxide-semiconductor field effect transistor (pMOSFET). It is understood that each of the first and second transistors (204 and 206) can be implemented by any of a variety of transistors or circuit components (e.g., a bipolar junction transistor (BJT), a transmission gate, etc.).

Referring still to FIG. 2A, in some embodiments, the voltage signal 201, received by the OP 202, has a respective voltage level. Such a voltage level may be iteratively determined by the control logic circuit 104, which will be discussed in further detail below with respect to FIGS. 3 and 4. In some embodiments, the OP 202 and the first transistor 204 form a negative feedback loop that is from the output of the OP 202, through the gate of the transistor 204 and the drain of the transistor 204 (i.e., node X), and back to the second input of the OP 202. Such a negative feedback loop may enable a voltage level of the voltage signal at node X (hereinafter "voltage signal X") to closely follow the voltage level of the voltage signal 201. As such, when the control logic circuit 104 updates the voltage level of the voltage signal 201, as mentioned above, the voltage level of the voltage signal X may change accordingly.

In some embodiments, since the node X is coupled to the first supply voltage 211 by only one transistor (e.g., the first transistor 204), the voltage signal X may be approximately equal to a voltage level of the first supply voltage 211 minus a voltage drop across source and drain the first transistor 204 (i.e., Vds of the first transistor 204). As such, the voltage level of the first supply voltage 211 can be subjected to one Vds plus the voltage level of the voltage signal X, which may advantageously reduce power consumption of the RRAM device 100 as a whole.

In the illustrated embodiment of FIG. 2A, the bit cell 102-1, coupled to the write circuit 108 at the node X, is implemented as a 1-transistor-1-resistor (1T1R) RRAM bit cell that includes a resistor 102-1R with a variable resistance value and a selection transistor 102-1T coupled in series. It is noted that the bit cell 102-1 may be implemented as any of other RRAM bit cell configurations such as, for example, multiple-transistor-1-resistor RRAM bit cell, while remaining within the scope of the present disclosure.

In the current example, more specifically, the resistor 102-1R has two ends, corresponding to respective top and bottom electrodes (not shown) of the resistor 102-1R, one of which is coupled to the BL 101 and the other of which is coupled the selection transistor 102-1T at the selection transistor 102-1T's drain. Further, the selection transistor 102-1T of the bit cell 102-1 is coupled to a WL 103 at its respective gate, and to the second supply voltage 213 at its respective source. In some embodiments, the selection transistor 102-1T may serve as a "switch" of the bit cell 102-1. For example, when the bit cell 102-1 is asserted to be written and/or read, the WL 103 is asserted to a logic high such that the selection transistor 102-1T is switched on (since the gate of the selection transistor 102-1T is gated by the logic state of the WL 103 and the transistor 102-1T is an nMOSFET). Once the selection transistor 102-1T is switched on, a conduction path along the bit cell 102-1 may be formed from the BL 101, through the resistor 102-1R and then the selection transistor 102-1T, and to the SL 105.

As mentioned above, the voltage signal X closely follows the voltage signal 201, which may be a set voltage or a reset voltage of the bit cell 102-1, in accordance with some embodiments. And BL 101 of the bit cell 102-1 is electrically coupled to the node X. Thus, the set/reset voltage of the bit cell 102-1 can be applied to the bit cell 102-1 via the BL 101. In some embodiments, when either of the set voltage and reset voltage is applied to the bit cell 102-1, a current signal 205 is conducted to flow through the bit cell 102-1. For clarity, the voltage signal 201 is herein referred to as "write voltage signal 201," and the current signal 205 is herein referred to as "write current signal 205." More specifically, when the write voltage signal 201 is the set voltage of the bit cell 102-1, which is followed by the voltage signal X, the voltage signal X may cause the bit cell 102-1 to transition from its respective HRS to LRS; and when the write voltage signal 201 is the reset voltage of the bit cell 102-1, which is followed by the voltage signal X, the voltage signal X may cause the bit cell 102-1 to transition from tis respective LRS to HRS. Accordingly, a current level of the write current signal 205 may vary during and after the transition from the LRS to HRS or the transition from the HRS to LRS. In some embodiments, the first and second transistors 204 and 206, which function as a current mirror, can mirror the write current signal 205 from the first transistor 204 to the second transistor 206. As such, a current signal 207, flowing through the second transistor 206, has a substantially similar current level as the current level of the write current signal 205.

As mentioned above, the current source 208 provides the reference current signal 209. In some embodiments, a current level of the reference current signal 209 may be iteratively determined by the control logic circuit 104, which will be discussed in further detail below with respect to FIGS. 3 and 4. In some embodiments, the second transistor 206, the current source 208, and the buffer circuit 210 may serve as a current monitor circuit to monitor the current signal 207 (i.e., the write current signal 205 flowing through the bit cell 102-1) by comparing the write current signal 205/207 with the reference current signal 209. More specifically, when the current level of the write current signal 205, flowing through the bit cell 102-1, is higher than the reference current signal 209, a logic high may be present at node Y, which causes the write current comparison signal 215 to be at logic low; and when the current level of the write current signal 205, flowing through the bit cell 102-1, is lower than the reference current signal 209, a logic low may be present at node Y, which causes the write current comparison signal 215 to be at logic high. The logic state of the write current comparison signal 215 is provided to the control logic circuit 104 to allow the control logic circuit 104 to determine whether to increase the voltage level of the write voltage signal 201 and the current level of the reference current signal 209, which will be discussed in further detail below. Although the write circuit 108 is coupled to the control logic circuit 104 via one line (e.g., a bus) in the illustrated embodiment of FIG. 1, it is noted that the control logic circuit 104 and the write circuit 108 may be coupled to each other via plural line, at least one of which is used by the write circuit 108 to receive a signal (e.g., the voltage signal 201) from the control logic circuit 104, and at least another one of which is used by the write circuit 108 to send a signal (e.g., the write current comparison signal 215) to the control logic circuit 104.

Figure 2B:
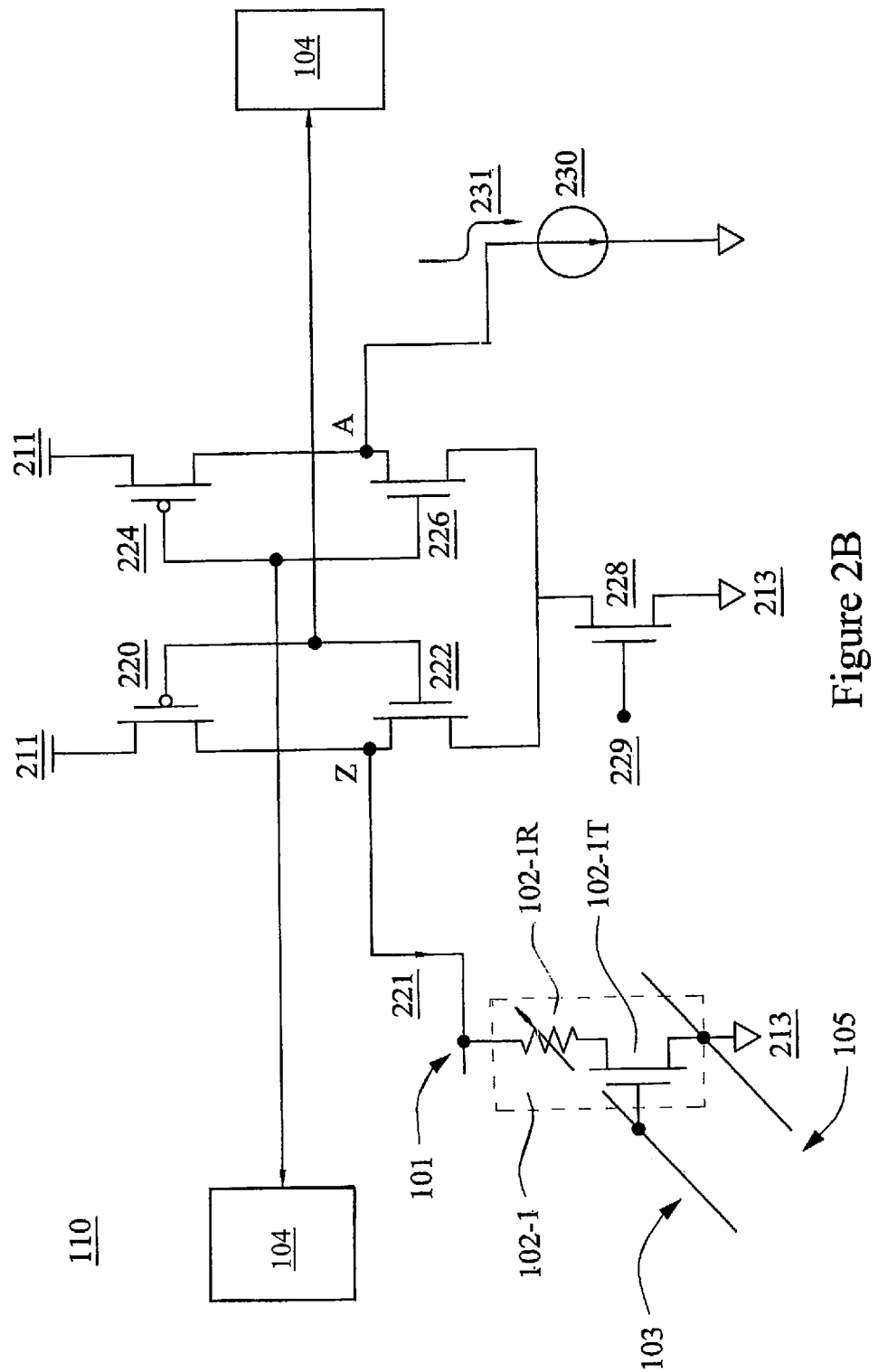
FIG. 2B illustrates an exemplary circuit diagram of a read circuit of the RRAM device of FIG. 1, in accordance with some embodiments.

FIG. 2B illustrates an exemplary circuit diagram of the read circuit 110, in accordance with some embodiments. The read circuit 110 includes transistors 220, 222, 224, 226, and 228. The transistors 220 and 224 are each implemented by a pMOSFET; and the transistors 222, 226, and 228 are each implemented by an n-type metal-oxide-semiconductor field effect transistor (nMOSFET). Each of the transistors 220, 222, 224, 226, and 228 can be implemented by a different type of MOSFET or any of a variety of other types of transistors (e.g., a BJT, a HEMT, or the like).

In some embodiments, the transistors 220, 222, 224, and 226 may serve as a current-mode or voltage-mode sensing amplifier. More specifically, the transistors 220 and 222 are formed as a first inverter, and the transistors 224 and 226 are formed as a second inverter, wherein the first and second inverters are cross-coupled with each other between the first supply voltage 211 and the transistor 228. The transistor 228 is coupled between the cross-coupled first and second inverters (formed by the transistors 220-222 and 224-226, respectively) and the second supply voltage 213. Respective drains of the transistors 220 and 222 are tied together at node Z, which is further coupled to gates of the transistors 224 and 226; and respective drains of the transistors 224 and 226 are tied together at node A, which is further coupled to the gates of the transistors 220 and 222. In some embodiments, the node Z is coupled to the BL 101 of the bit cell 102-1, and configured to receive a current signal 221 conducting through the bit cell 102-1, and node A is coupled to a reference current source 230 and configured to receive a reference current signal 231 provided by the reference current source 230.

It is noted that operations of the read circuit 110 should be known by persons of ordinary skill in the art, such that the operations of the read circuit 110 are briefly described below. The current signals 221 and 231 may serve as inputs of the read circuit 110, and after the transistor 228 is turned on by a read enable signal 229, the first and second cross-coupled inverters (formed by the transistors 220-222 and 224-226, respectively) can sense a large enough difference between the current signals 221 and 231 so as to determine a logic state present by the bit cell 102-1, which may be latched at the gates of the transistors 220 and 222. Once the logic state of the bit cell 102-1 is determined, the logic state may be provided to the control logic circuit 104 as an output of the read circuit 110. In some embodiments, when the bit cell 102-1 is read, the current signal 221 may be referred to as a "read" current signal, which is different from the write current signal 205 (FIG. 2A) when the bit cell 102-1 is written. Typically, the read current signal 221 presents a lower current level than the write current signal 205 does.

Figure 3:
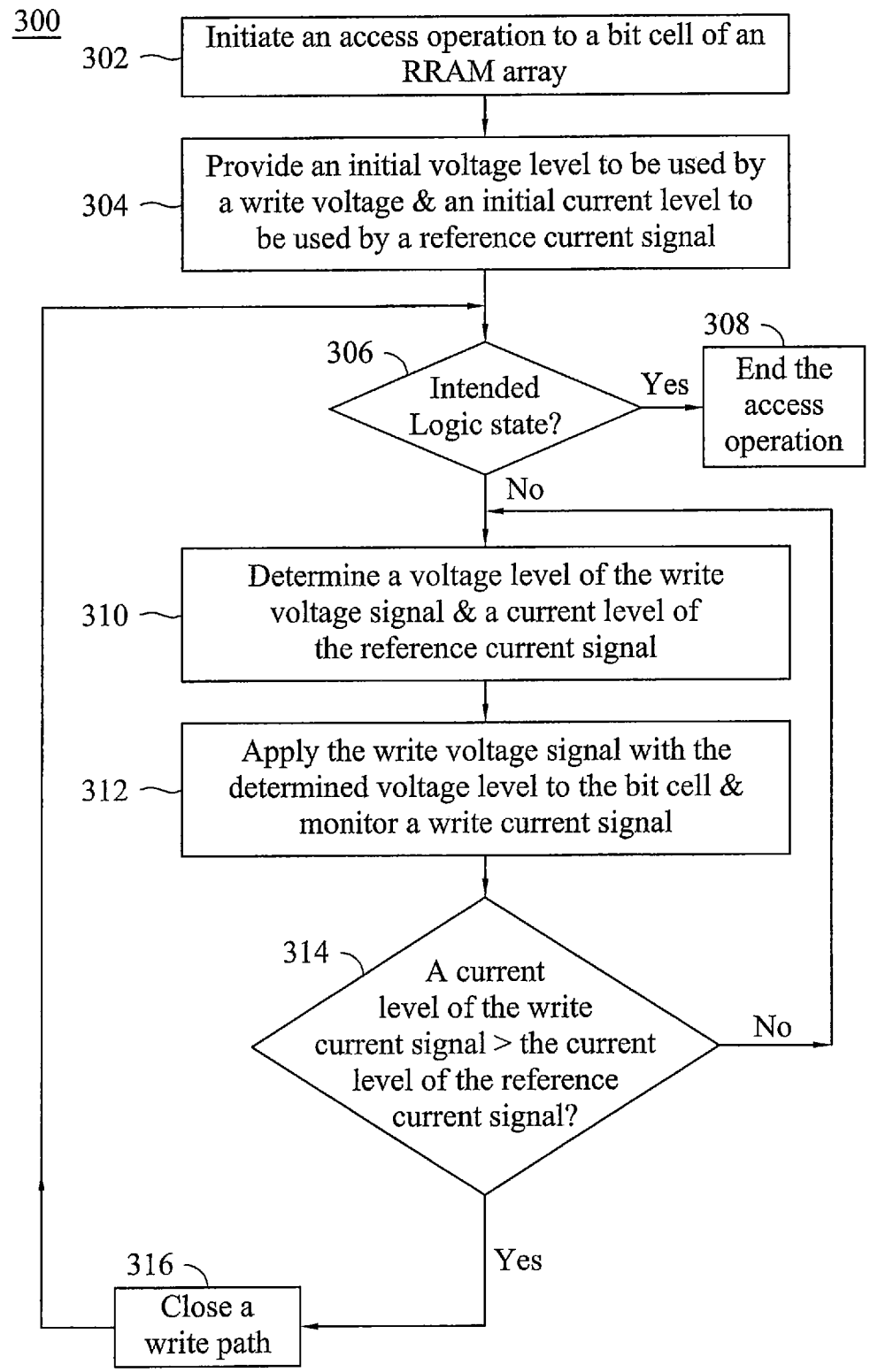
FIG. 3 illustrates a flow chart of an exemplary method to operate the RRAM device of FIG. 1, in accordance with some embodiments.

FIG. 3 illustrates a flow chart of an exemplary method 300 to operate the RRAM device 100, in accordance with various embodiments. In various embodiments, the operations of the method 300 are performed by the respective components illustrated in FIGS. 1-2B. For purposes of discussion, the following embodiment of the method 300 will be described in conjunction with FIGS. 1-2B. The illustrated embodiment of the method 300 is merely an example. Therefore, it should be understood that any of a variety of operations may be omitted, re-sequenced, and/or added while remaining within the scope of the present disclosure.

The method 300 starts with operation 302 in which an access operation is initiated to be performed to a bit cell of an RRAM array, in accordance with various embodiments. In some embodiments, such an access operation may include at least one read operation and zero or at least one write operation, which will be discussed below. Further, in some embodiments, an intended logic state to be written to the bit cell may be determined in the operation 302. In such embodiments, when the bit cell has presented the intended logic state, the access operation may be stopped. The method 300 continues to operation 304 in which an initial voltage level to be used by a write voltage signal and an initial current level to be used by a reference current signal are provided, in accordance with various embodiments. In some embodiments, the initial voltage level and the initial current level may be determined concurrently, and such initial voltage level and initial current level, which correspond to each other, may be pre-determined by the control logic circuit 104, for example, based on the intended logic state. In some embodiments, the control logic circuit 104 may determine the initial voltage and current levels to be substantially low but high enough to write the intended logic state to the bit cell. It is noted that subsequently to the operation 304 and prior to any further operation, no write operation has been performed on the bit cell.

The method 300 continues to determination operation 306 in which an initial read operation is performed to determine whether the bit cell has already presented the intended logic state, in accordance with various embodiments. In some embodiments, in the determination operation 306, if the logic state of the bit cell presents the intended logic state, the method 300 proceeds to operation 308 in which the access operation is ended (since the intended logic state has been written to the bit cell). On the other hand, if the logic state of the bit cell does not present the intended logic state, the method 300 proceeds to operation 310 in which respective voltage level of the write voltage signal and current level of the reference current signal are determined.

According to an embodiment, in the operation 310, the initial voltage level and the initial current level provided at the operation 304 may be respectively determined to be used by the write voltage signal and the reference current signal. It is noted that, in accordance with various embodiments, the voltage level of the write voltage signal and the current level of the reference current signal may be iteratively updated in accordance with each other based on operations of the RRAM device 100, which will be discussed below.

Next, the method proceeds to operation 312, the bit cell is written to the intended logic state using the write voltage signal with the initial voltage level and a current level of a write current signal is monitored, in accordance with various embodiments. In some embodiments, the write operation begins when the operation 312 is performed. As mentioned above, in some embodiments, such a write current signal includes a current signal flowing through the bit cell when the bit cell is written. The method 300 proceeds to determination operation 314 in which the current level of the write current signal is compared with the current level of the reference current signal. As mentioned above (operation 310), the initial current level is determined to be used by the reference current signal. In other words, the current level of the write current signal flowing through the bit cell, which may vary with a resistance change of the bit cell, is dynamically compared with the initial current level.

In the determination operation 314, if the current level of the write current signal is smaller than the initial current level, the method 300 loops back to the operation 310. In this scenario, in the operation 310, an updated voltage level of the write voltage signal may be determined, and accordingly, an updated current level of the reference current signal may be also determined since the write voltage signal and reference current signal correspond to each other, in accordance with some embodiments. In some embodiments, the control logic circuit 104 may pre-determine respective increments of the current level of the reference current signal and the voltage level of the write voltage signal to be substantially small. Similarly, the method 300 proceeds to the operation 312 to write the bit cell to the intended logic state using the write voltage signal with the "updated" voltage level and monitor the current level of the write current signal using the "updated" current level, and then proceeds to the operation 314 to compare again the current level of the write current signal with the updated current level of the reference current signal when the bit cell is written under the updated voltage level. It is noted that every time the voltage level of the write voltage signal is updated, the current level of the reference current signal is updated accordingly, as mentioned above. In some embodiments, the method 300 may iteratively perform such a first loop operation (operations 310, 312, 314, and back to 310) until the current level of the write current signal is equal to or larger than the determined current level (e.g., the updated current level) of the reference current signal.

On the other hand, in the determination operation 314, if the current level of the write current signal is larger than the first current level, the method 300 proceeds to operation 316 in which a write path is closed. In some embodiments, when the write path is closed, the write voltage signal may not be applied to the bit cell anymore, which will be discussed in further detail below. The method 300 then loops back to the determination operation 306 to check again whether the intended logic state has been written to the bit cell. If yes, the method 300 proceeds to the operation 308 in which the access operation is ended. If not, the method 300 may iteratively perform a second loop operation (operations 306, 310, 312, 314, 316, and back to 306) until the intended logic state has been written to the bit cell.

Figure 4:
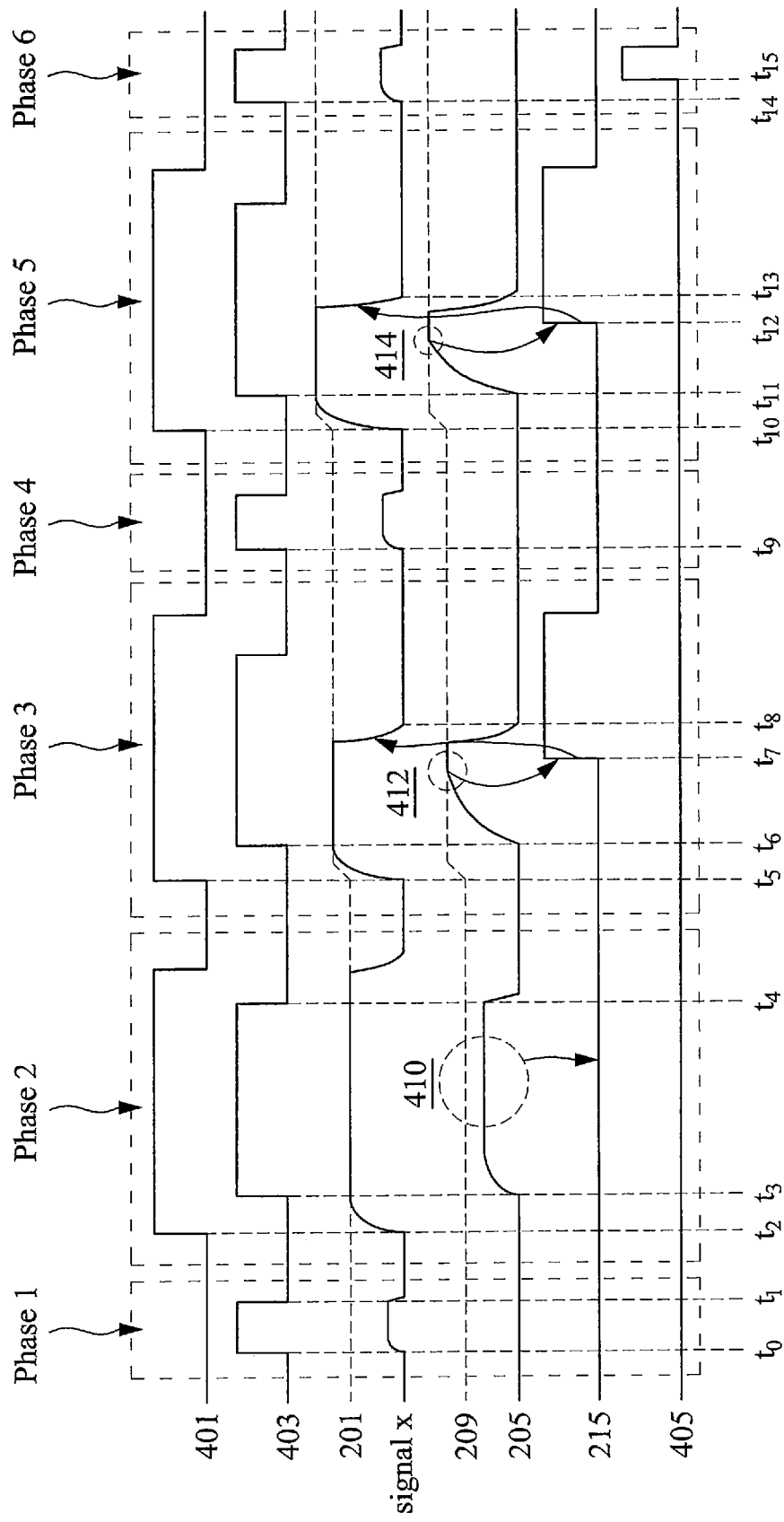
FIG. 4 illustrates exemplary waveforms of plural signals when the RRAM device of FIG. 1 is operated based on the method of FIG. 3, in accordance with some embodiments.

FIG. 4 illustrates exemplary waveforms of plural signals (e.g., the write voltage signal 201, the voltage signal X, the write current signal 205, the reference current signal 209, a write enable signal 401 (determined and provided by the control logic circuit 104), a WL assertion signal 403 (determined and provided by the control logic circuit 104), an inverted write current comparison signal 215', and a read-pass signal 405 (determined and provided by the control logic circuit 104)) when the method 300 of FIG. 3 is performed to operate the RRAM device 100, in accordance with various embodiments. As mentioned above, the operations of the method 300 are performed by the respective components illustrated in FIGS. 1-2B. For purposes of discussion, the following embodiment of FIG. 4 will be described in conjunction with the components of FIGS. 1-2 and the operations of FIG. 3.

In some embodiments, the write enable signal 401 is provided by the control logic circuit 104 to alternately enable the write circuit 108 and the read circuit 110 so as to alternately perform the write and read operations. In a non-limiting example, when the write enable signal 401 is pulled to a logic high state, the write circuit 108 is enabled and the read circuit 110 is disabled; and when the write enable signal 401 is pulled to a logic low state, the write circuit 108 is disabled and the read circuit 110 is enabled. The WL assertion signal 403 is also provided by the control logic circuit 104 to assert a WL, e.g., 103, through the address decoder 106 so as to allow at least a bit cell, e.g., 102-1, along that WL to be read and/or written. The inverted write current comparison signal 215' is logically inverted to the write current comparison signal 215 to indicate a comparison result between current levels of the write current signal and the reference current signal. The read-pass signal 405 is also provided by the control logic circuit 104 to indicate whether an intended logic state has been successfully written to that exemplary bit cell 102-1.

In some embodiments, the write enable signal 401, the WL assertion signal 403, the inverted write current comparison signal 215', and the read-pass signal 405 each transitions between a logic high state (hereinafter "HIGH") and a logic low state (hereinafter "LOW") over time; the write voltage signal 201 and the voltage signal X each transitions between respective voltage levels over time; and the write current signal 205 and the reference current signal 209 each transitions between respective current levels over time.

In the illustrated embodiment of FIG. 4, the bit cell 102-1 is selected to be accessed and a logic 1 is intended to be written to the bit cell 102-1, which corresponds to the operation 302. Next, corresponding to the operation 304, the initial voltage level to be used by the write voltage signal 201 and the initial current level to be used by the reference current signal 209 are respectively provided prior to time "$t_0$." Next, at time "$t_0$," corresponding to the operation 306, the write enable signal 401 is at LOW since the bit cell 102-1 is to be read (the write circuit 108 is disabled and the read circuit 110 is enabled) and the WL assertion signal 403 transition to HIGH so that the bit cell 102-1 can be read. It is noted that the WL assertion signal 403 has a pulse width with a time period that extends from time $t_0$ to time $t_1$. Such a time period may be pre-defined based on how long the bit cell 102-1 is allowed to be read, according to some embodiments. During such a "read" period, the bit cell 102-1 is read by the read circuit 110.

More specifically, in FIG. 4, the voltage level of the signal X, which corresponds to a voltage level at the node Z of the read circuit 110 (FIG. 2B), may transition to a higher voltage level in response to such a read operation; the current level of the write current signal 205 is at LOW since the write circuit 108 is disabled; and the inverted write current comparison signal 215' is at LOW since the write circuit 108 is disabled and no comparison between the reference current signal and write current signal has been performed yet. In the current example, since the logic state originally presented by the bit cell 102-1, which is read out by the read circuit 110, is not consistent with the intended logic state, the control logic circuit 104 determines the read-pass signal 405 as LOW. Although not shown in FIG. 4, it is understood that a current level of the read current signal 221 (FIG. 2B) may transitions from LOW to a higher current level in response to the read operation.

Since in the above example, the logic state originally presented by the bit cell 102-1 is not the intended logic state, next, starting at time "$t_2$," a write operation is initiated, which corresponds to the operation 310, 312, and 314. More specifically, at time $t_2$, the write enable signal 401 transitions to HIGH so that the write circuit 108 is enabled (and the read circuit 110 is disabled) such that the signal X starts to follow the write voltage 201 whose voltage level is determined to be at the initial voltage level, which corresponds to the operation 310. Next, at time "$t_3$," the WL assertion signal 403 transitions to HIGH so that the bit cell 102-1 can be written, which corresponds to the operation 312. More specifically, during such a write operation, the voltage level of the signal X transitions to be about the same as the initial voltage level of the write voltage 201, and the current level of the write current signal 205 transitions to a higher current level.

Based on the above discussion of the method 300, the current level of the write current signal 205 is monitored at the operation 312. And, at the operation 314, the current level of the write current signal 205 is compared with the initial current level of the reference current signal 209 to determine whether the method 300 proceeds with the first loop operation or to the operation 316. In the current example as shown in FIG. 4, the current level of the write current signal 205 is lower than the initial current level of the reference current signal 209, as indicated by 410 in FIG. 4, which causes the inverted write current comparison signal 215' to remain at LOW (since the write current comparison signal 215 is output as HIGH). As such, the method 300 proceeds with the first loop operation as mentioned above (i.e., operations 310, 312, 314, and back to 310) until the current level of the write current signal 205 is equal to or larger than a respective current level (e.g., an updated current level) of the reference current signal 209. It is noted that the read-pass signal 405 remains at LOW since no read operation has been performed yet after time $t_2$.

Similar to the read operation, in some embodiments, the WL assertion signal 403 also has a pulse width with a pre-defined time period during the write operation. For example, the time period of the WL assertion signal 403 during the write operation extends from time $t_3$ to time $t_4$. During such a "write" period, the bit cell 102-1 is written by the write circuit 108. In some embodiments, concurrently with or subsequently to time $t_4$, the write enable signal 401 transitions to LOW (disabling the write circuit 108), which causes the voltage level of the signal X to transition to ground, so as to allow a subsequent operation to be performed on the bit cell 102-1.

As mentioned above, the first loop operation is initiated, which may start at time "$t_5$." At time $t_5$, the write enable signal 401 transitions again to HIGH so that the write circuit 108 is enabled (and the read circuit 110 is disabled) such that the signal X starts to follow the write voltage 201. In the current example, the voltage level of the write voltage signal 201 is determined to be updated (e.g., increased) from the initial voltage level, which corresponds to the operation 310. As mentioned above, when the voltage level of the write voltage signal 201 is updated, the current level of the reference current signal 209 is updated (e.g., increased) from the initial current level accordingly. For purposes of clarity of illustration, such voltage level and current level updated at time $t_5$ are herein referred to as "first updated voltage level" and "first updated current level," respectively. Next, at time "$t_6$," the WL assertion signal 403 transitions again to HIGH so that the bit cell 102-1 can be written, which corresponds to the operation 312. More specifically, during such a write operation, the current level of the write current signal 205 transitions to a relatively higher current level when compared to the initial current level.

Similarly, the current level of the write current signal 205 is again monitored at the operation 312. And, at the operation 314, the current level of the write current signal 205 is compared with the first updated current level of the reference current signal 209 to determine whether the method 300 proceeds with the first loop operation or to the operation 316. In the current example as shown in FIG. 4, the current level of the write current signal 205 is equal to the first updated current level of the reference current signal 209, as indicated by 412 in FIG. 4, which causes the inverted write current comparison signal 215' to transition to HIGH at time "$t_7$" (since the write current comparison signal 215 is output as LOW). As such, the method 300 proceeds to the operation 316 in which the write path is closed. In some embodiments, the control logic circuit 104 may close the write path by performing at least one of: floating the voltage signal 201, pulling the voltage signal 201 to ground, and causing the write circuit 108 to pull the voltage level of the signal X to ground. As shown in FIG. 4, the voltage level of the signal X is pulled to ground at time $t_8$, and accordingly, the current level of the write current signal 205 is pulled to zero.

Based on the above discussion, the method 300 loops back to the operation 306 to check again whether the intended logic state has been written to the bit cell. If yes, the method 300 proceeds to the operation 308 in which the access operation is ended. If not, the method 300 may iteratively perform the second loop operation (operations 306, 310, 312, 314, 316, and back to 306) until the intended logic state has been written to the bit cell. Thus, at time "$t_9$," another read operation is performed. In the current example of FIG. 4, after the read operation, the control logic circuit 104 may still determine that the intended logic state is not written to the bit cell 102-1 yet such that the method 300 proceeds with the second loop operation to perform at least one write operation.

As shown in FIG. 4, next, at time $t_{10}$, the write enable signal 401 transitions again to HIGH so that the write circuit 108 is enabled (and the read circuit 110 is disabled) such that the signal X starts to follow the write voltage 201. In the current example, the voltage level of the write voltage signal 201 is determined to be updated again (e.g., increased) from the first updated voltage level, which corresponds to the operation 310. As mentioned above, when the voltage level of the write voltage signal 201 is updated, the current level of the reference current signal 209 is updated (e.g., increased) from the initial current level accordingly. For purposes of clarity of illustration, such voltage level and current level updated at time $t_{10}$ are herein referred to as "second updated voltage level" and "second updated current level," respectively. Next, at time "$t_{10}$," the WL assertion signal 403 transitions again to HIGH so that the bit cell 102-1 can be written, which corresponds to the operation 312. More specifically, during such a write operation, the current level of the write current signal 205 transitions to a relatively higher current level when compared to the first updated current level.

Similarly, the current level of the write current signal 205 is again monitored at the operation 312. And, at the operation 314, the current level of the write current signal 205 is compared with the second updated current level of the reference current signal 209 to determine whether the method 300 proceeds with the first loop operation or to the operation 316. In the current example as shown in FIG. 4, the current level of the write current signal 205 is equal to the second updated current level of the reference current signal 209, as indicated by 414 in FIG. 4, which causes the inverted write current comparison signal 215' to transition to HIGH at time "$t_{12}$" (since the write current comparison signal 215 is output as LOW). As such, the method 300 proceeds to the operation 316 in which the write path is again closed. As shown, the voltage level of the signal X is pulled to ground at time $t_{13}$, and accordingly, the current level of the write current signal 205 is pulled to zero.

Based on the above discussion, the method 300 again loops back to the operation 306 to check whether the intended logic state has been written to the bit cell. In the current example of FIG. 4, at time "$t_{14}$," another read operation is performed. In some embodiments, after the read operation, the control logic circuit 104 may determine that the intended logic state is written to the bit cell 102-1, such that the read-pass signal 405 transitions to HIGH a time "$t_{15}$."Accordingly, the method 300 proceeds to the operation 308 to end the access operation.

It is noted that the embodiment of FIG. 4 merely illustrates an exemplary operation of the RRAM device 100 when the method 300 of FIG. 3 is used. Six phases are shown to illustrate the operation, and such six phases sequentially occur based on a determination/result from a previous phase. For example, in FIG. 4, Phase 1 corresponds to the operation 306 of the method 300, and since the original logic state presented by the bit cell 102-1 is not consistent with the intended logic state, the operation proceeds to Phase 2. Phase 2 corresponds to the operations 310, 312, and 314 of the method 300, and since the write current level is not larger than initial current level, the operation proceeds to Phase 3. Phase 3 corresponds to the operations 310, 312, 314, and 316 of the method 300, and since the write current level is larger than first updated current level, the operation proceeds to Phase 4. Phase 4 corresponds to the operation 306 of the method 300, and since the logic state presented by the bit cell 102-1 is still not consistent with the intended logic state, the operation proceeds to Phase 5. Phase 5 corresponds to the operations 310, 312, 314, and 316 of the method 300, and since the write current level is larger than first updated current level, the operation proceeds to Phase 6. Phase 6 corresponds to the operation 306 of the method 300, and since the logic state presented by the bit cell 102-1 is consistent with the intended logic state, the operation ends.

Figure 5:
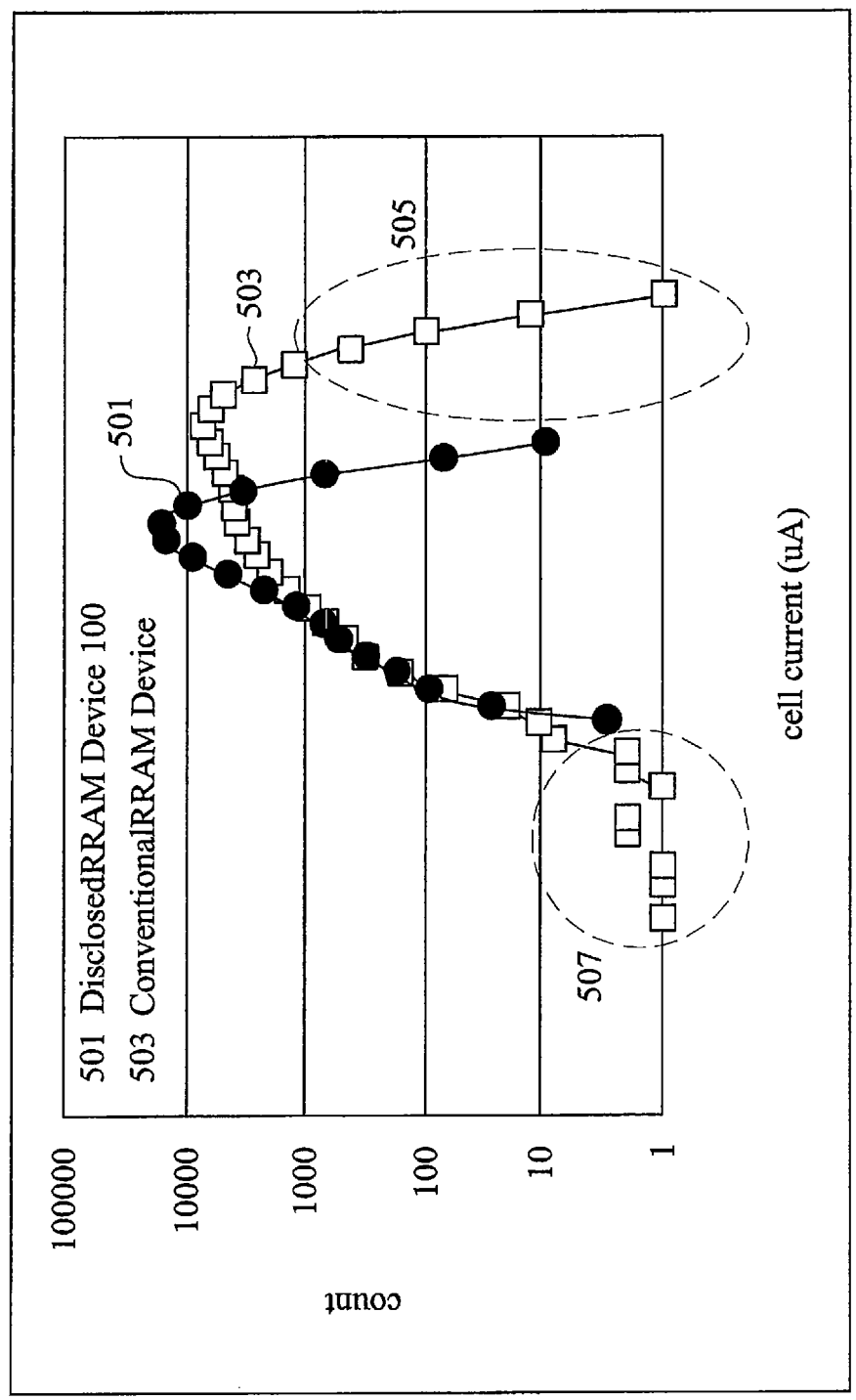
FIG. 5 illustrates an exemplary chart comparing respective endurances of the RRAM device of FIG. 1 and a conventional RRAM device, in accordance with some embodiments.

As mentioned above, using such a combination of write and read monitoring may advantageously avoid various issues encountered by the conventional RRAM device, e.g., deteriorated endurance and/or yield of the RRAM device. FIG. 5 shows an example comparing respective operations of the disclosed RRAM device 100 and a conventional RRAM device. As shown, line 501 represents an operation curve of the disclosed RRAM device 100, and line 503 represents an operation curve of the conventional RRAM device after the disclosed RRAM device 100 and the conventional RRAM device have been operated for at least one write operation, each of which is a function of "count (the Y axis)" versus "cell current (the X axis)." Specifically, the count in FIG. 5 corresponds to a number of bit cells of the RRAM device; and the cell current corresponds to a current conducting through each bit cell of the RRAM device. It can be seen from FIG. 5 that the conventional RRAM device (line 503) has plural data points in regions 505 and 507, respectively, while data points of the disclosed RRAM device 100 (line 501) are relatively centralized toward a peak of the line 501. As known by persons of ordinary skill in the art, performance (e.g., endurance, yield, etc.) of an RRAM device can be assessed by such an operation curve, and generally, an RRAM device having a relatively decentralized operation curve (e.g., line 503) presents a poorer endurance and a lower yield.

For example, data points of the line 503 in region 505, which present a substantial number of bit cells in the conventional RRAM device that each has a relatively larger cell current conducting through, may be due to the lack of writing monitoring in the conventional RRAM device. Such higher cell currents hurt the endurance of the bit cells of the conventional RRAM device. In contrast, the disclosed RRAM device 100 monitors the write voltage/current (e.g., the operations 312 and 314 of the method 300 in FIG. 3) while writing the respective bit cell(s), which avoids applying too much voltage/current on the bit cell(s) that can deteriorate the endurance of the bit cell. In some embodiments, even though the write voltage/current is monitored and controlled, applying a "monitored and controlled" write voltage/current on a bit cell for too long may also hurt the bit cell (e.g., causing the bit cell to become a tailing bit that can only conduct a substantially low cell current). The data points of the line 503 in region 507 present a substantial number of the tailing bits in the conventional RRAM device that each can only have a relatively smaller cell current conducting through since such tailing bits may have been written for too long (i.e., the lack of read monitoring in the conventional RRAM device). In contrast, the disclosed RRAM device 100 monitors whether the respective bit cell has already been written into an intended logic state (e.g., the operation 306 of the method 300 in FIG. 3) immediately after each iteration in which the voltage level of the write voltage signal is increased by a substantially small amount. As such, the bit cell may not be overly written (e.g., written for too long), which avoids the bit cell from becoming a tailing bit. In accordance with such writing and reading monitoring in the disclosed RRAM device 100, the line 501 (the operation curve of the disclosed RRAM device 100) can be advantageously centralized when compared to the line 503 (the operation curve of the conventional RRAM device), which presents a better endurance and a less amount of tailing bits (i.e., a higher yield).

In an embodiment, a memory device includes: a memory bit cell; a write circuit, coupled to the memory bit cell, and configured to use a first voltage to transition the memory bit cell to a first logic state by changing a respective resistance state of the memory bit cell, and compare a first current flowing through the memory bit cell with a first reference current; and a control logic circuit, coupled to the write circuit, and configured to determine whether the first logic state is successfully written into the memory bit cell based on a read-out logic state of the memory bit cell and the comparison between the first current and first reference current.

Yet in another embodiment, a method includes: providing a first voltage to transition a memory bit cell to a first logic state by changing a respective resistance state of the memory bit cell; comparing a first current flowing through the memory bit cell with a first reference current; and monitoring the comparison between the first current and first reference current, and a read-out logic state of the memory bit cell to determine whether the first logic state is successfully written into the memory bit cell.

Yet in another embodiment, a method includes: providing a first voltage to transition a memory bit cell to a first logic state; comparing a first current corresponding to the first voltage and flowing through the memory bit cell with a first reference current; when the first current is higher than the first reference current, comparing a read-out logic state of the memory bit cell with the first logic state to determine whether to cease providing the first voltage to the memory bit cell or to provide a second voltage to transition the memory bit cell still to the first logic state; and when the first current is lower than the first reference current, providing a third voltage to transition the memory bit cell still to the first logic state, and comparing a third current corresponding to the third voltage and flowing through the memory bit cell with a third reference current, wherein the second voltage and the third voltage are different from the first voltage.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
 a memory bit cell;
 a write circuit, coupled to the memory bit cell, and configured to use a first voltage to transition the memory bit cell to a first logic state by changing a respective resistance state of the memory bit cell, and compare a first current flowing through the memory bit cell with a first reference current; and
 a control logic circuit, coupled to the write circuit, and configured to determine whether the first logic state is successfully written into the memory bit cell based on a read-out logic state of the memory bit cell and the comparison between the first current and first reference current,
 wherein when the read-out logic state is consistent with the first logic state, the control logic circuit is further configured to cease providing the first voltage to the memory bit cell,
 wherein when the read-out logic state is not consistent with the first logic state, the control logic circuit further causes the write circuit to use a second voltage to transition the memory bit cell still to the first logic state, and compare a second current flowing through the memory bit cell with a second reference current, and
 wherein the second voltage is higher than the first voltage, and the second reference current is higher than the first reference current.

2. The memory device of claim 1, wherein the memory bit cell comprises a resistive type random access memory bit cell.

3. The memory device of claim 1, wherein the write circuit is configured to determine the first voltage as a supply voltage minus a voltage drop across respective source and drain ends of a single transistor.

4. The memory device of claim 1, further comprising at least a sensing amplifier, coupled to the memory bit cell, and configured to provide the read-out logic state to the control logic circuit.

5. The memory device of claim 1, wherein when the write circuit determines that the first current is not lower than the first reference current, the write circuit causes the control logic circuit to further compare the read-out logic state with the first logic state.

6. The memory device of claim 5, wherein when writing the memory bit cell, a set voltage is applied across the top and bottom electrodes to change the variable resistance dielectric layer from a first resistivity to a second resistivity.

7. The memory device of claim 1, wherein the memory bit cell includes a top electrode and a bottom electrode with a variable resistance dielectric layer interposed therebetween.

8. The memory device of claim 7, further comprising:
when the first current is lower than the first reference current, providing a third voltage to transition the memory bit cell still to the first logic state, and comparing a third current corresponding to the third voltage and flowing through the memory bit cell with a third reference current, wherein the second voltage and the third voltage are different from the first voltage, wherein the second and third voltages are both higher than the first voltage, and the second and third reference currents are both higher than the first reference current.

9. A method, comprising:
providing a first voltage to transition a memory bit cell to a first logic state;
comparing a first current flowing through the memory bit cell with a first reference current; and
monitoring the comparison between the first current and first reference current, wherein when the first current is lower than the first reference current, the method further comprises:
providing a second voltage to transition the memory bit cell still to the first logic state; and
comparing a second current flowing through the memory bit cell with a second reference current, wherein when a read-out logic state of the memory bit cell is consistent with the first logic state, the method further comprises ceasing providing the first voltage to the memory bit cell.

10. The method of claim 9, wherein the memory bit cell comprises a resistive type random access memory bit cell.

11. The method of claim 9, wherein when the first current is not lower than the first reference current, the method further comprises comparing the read-out logic state with the first logic state.

12. The method of claim 9, wherein when the read-out logic state is not consistent with the first logic state, the method further comprises:
providing a third voltage to transition the memory bit cell still to the first logic state.

13. The method of claim 12, wherein when the read-out logic state is not consistent with the first logic state, the method further comprises:
comparing a third current flowing through the memory bit cell with a third reference current.

14. The method of claim 13, wherein the second voltage is higher than the first voltage, and the second reference current is higher than the first reference current.

15. A method, comprising:
providing a first voltage to transition a memory bit cell to a first logic state;
comparing a first current corresponding to the first voltage and flowing through the memory bit cell with a first reference current;
when the first current is higher than the first reference current, comparing a read-out logic state of the memory bit cell with the first logic state;
when the read-out logic state is the same as the first logic state, ceasing to provide the first voltage to the memory bit cell; and
when the read-out logic state is not the same as the first logic state, providing a second voltage to the memory bit cell.

16. The method of claim 15, wherein the memory bit cell comprises a resistive type random access memory bit cell.

17. The method of claim 16, further comprising determining the first voltage as a supply voltage minus a voltage drop across respective source and drain ends of a single transistor.

18. The method of claim 15, further comprising providing the read-out logic state to a control logic circuit.

19. The method of claim 16, further comprising:
when the first current is lower than the first reference current, providing a third voltage to transition the memory bit cell still to the first logic state, and comparing a third current corresponding to the third voltage and flowing through the memory bit cell with a third reference current, wherein the second voltage and the third voltage are different from the first voltage.

20. The method of claim 19, wherein the second and third voltages are both higher than the first voltage, and the second and third reference currents are both higher than the first reference current.

* * * * *